US006754881B2

(12) United States Patent
Kuhlmann et al.

(10) Patent No.: US 6,754,881 B2
(45) Date of Patent: Jun. 22, 2004

(54) FIELD PROGRAMMABLE NETWORK PROCESSOR AND METHOD FOR CUSTOMIZING A NETWORK PROCESSOR

(75) Inventors: Charles Edward Kuhlmann, Raleigh, NC (US); Charles Steven Lingafelt, Durham, NC (US); Francis Edward Noel, Jr., Durham, NC (US); Ann Marie Rincon, Burlington, VT (US); Norman Clark Strole, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 10/016,346

(22) Filed: Dec. 10, 2001

(65) Prior Publication Data

US 2003/0110463 A1 Jun. 12, 2003

(51) Int. Cl.$^7$ ............................................. G06F 17/50
(52) U.S. Cl. .......................... 716/16; 716/1; 326/37; 326/39; 712/1; 712/32
(58) Field of Search ...................... 716/1–18; 326/37, 326/39; 712/1, 32

(56) References Cited

U.S. PATENT DOCUMENTS

| | | | |
|---|---|---|---|
| 6,134,173 A | 10/2000 | Cliff et al. ............. 265/230.03 |
| 6,173,419 B1 | 1/2001 | Barnett ........................ 714/28 |
| 6,178,541 B1 | 1/2001 | Joly et al. ..................... 716/17 |
| 6,181,159 B1 | 1/2001 | Rangasayee ................. 326/39 |
| 6,182,206 B1 | 1/2001 | Baxter .......................... 712/43 |
| 6,182,247 B1 | 1/2001 | Hermann et al. ............ 714/39 |
| 6,191,614 B1 | 2/2001 | Schultz et al. ................ 326/41 |
| 6,209,118 B1 | 3/2001 | LaBerge ....................... 716/1 |
| 6,211,697 B1 | 4/2001 | Lien et al. .................... 326/41 |
| 6,219,819 B1 | 4/2001 | Vashi et al. .................. 716/3 |
| 6,219,833 B1 | 4/2001 | Solomon et al. .............. 717/5 |
| 6,223,148 B1 | 4/2001 | Stewart et al. ............... 703/25 |
| 6,223,313 B1 | 4/2001 | How et al. .................. 714/724 |
| 6,226,776 B1 | 5/2001 | Panchul et al. ............... 716/3 |
| 6,230,119 B1 | 5/2001 | Mitchell ...................... 703/27 |
| 6,237,021 B1 | 5/2001 | Drummond ................. 709/201 |
| 6,247,147 B1 | 6/2001 | Beenstra et al. .............. 714/39 |
| 6,249,143 B1 | 6/2001 | Zaveri et al. ................. 326/40 |
| 6,252,422 B1 | 6/2001 | Patel et al. ................... 326/80 |
| 6,253,267 B1 | 6/2001 | Kim et al. .................. 710/103 |
| 6,256,296 B1 | 7/2001 | Ruziak et al. ............. 370/277 |
| 6,260,087 B1 | 7/2001 | Chang ........................ 710/100 |
| 6,260,182 B1 | 7/2001 | Mohan et al. ................ 716/12 |
| 6,260,185 B1 | 7/2001 | Sasaki et al. ................. 716/18 |
| 6,272,451 B1 * | 8/2001 | Mason et al. ................ 703/13 |
| 6,545,501 B1 * | 4/2003 | Bailis et al. .................. 326/10 |
| 2002/0122386 A1 * | 9/2002 | Calvignac et al. .......... 370/230 |

OTHER PUBLICATIONS http://www.chipcenter.com/pld/products_500–599/prod 578.htm, Product Review from Adaptive Silicon, Inc. (ASi), "Adaptive Silicon Announces FPGA Core," EETIMES Network, Mar. 12, 2001, pp. 1–4.*

(List continued on next page.)

Primary Examiner—Vuthe Siek
(74) Attorney, Agent, or Firm—Sawyer Law Group

(57) ABSTRACT

A network processor is disclosed. The network processor comprises a plurality of standard cells; and at least one field programmable gate array (FPGA) cell that can communicate with at least one of the standard cells. The at least one FPGA cell can provide a specified function based upon field programming techniques to allow for customization of the network processor. Utilizing a method and system in accordance with the present invention, a network processor can be customized to implement a variety of functions in hardware using embedded FPGA macros. The combined technology of ASIC standard cells plus FPGA cells enables fast time-to-market for new designs while optimizing cost and performance. In addition, the combined ASIC plus FPGA on a single die allows the chip developer to use proven standard cell macros for common logic and programmable cells for high-risk logic. Through a system and method in accordance with the present invention a business process is also provided whereby an ASIC customer can either submit a custom logic file to a vendor or choose from a library of functions to program into the FPGA portion of the chip.

6 Claims, 3 Drawing Sheets

OTHER PUBLICATIONS http://www.eetimes.com/printableArticle?doc_id+OEG 20000818S0011: Craig Matsumoto, "Lucent hybrid combines FPGA, ASIC features," EETIMES, Aug. 18, 2000, p. 1.* htt;://www.chipcenter.com/asic/products_100–199/prod 143.\html: "Editor's Choice, Tensilica Unveils Support Network," EETIMES Network, Oct. 9, 2000, pp. 1–2.* http://www.mdronline.com/publications/epw/issues/epw_116.html: Cary D. Snyder, "Embedded Processor Watch," Sep. 19, 2000, pp. 1–5.* http://www.chipcenter.com/asic/products_100–199/prod 104.html: Lucent Introduces the ORCA Series 4 FPGA, EETIMES Network, Jul. 3, 2000, pp. 1–5.*

Bombana et al. "IP–based design of custom Field Programmable Network Processors," IEEE, 1998, pp. 467–471.*

R. T. Bailis et al., U.S. Pending patent application Ser. No. 10/016772 (docket RPS920010126US1), "Method and System for Use of an Embedded Field Programmable Gate Array Interconnect for Flexible I/O Connectivity".

R. T. Bailis et al., U.S. Pending patent application Ser. No. 10/016449 (docket RPS920010127US1), "Method and System for Use of a Field Programmable Gate Array Function within an Application Specific Integrated Circuit (ASIC) to Enable Creation of a Debugger Client within the ASIC".

R. T. Bailis et al., U.S. Pending patent application Ser. No. 10/016448 (docket RPS920010128US1), "Method and System for Use of a Field Programmable Function within an Application Specific Integrated Circuit (ASIC) to Access Internal Signals for External Observation and Control".

R. T. Bailis et al., U.S. Pending patent application Ser. No. 10/015922 (docket RPS920010129US1), "Method and System for Use of a Field Programmable Interconnect within an ASIC for Configuring the ASIC".

R. T. Bailis et al., U.S. Pending patent application Ser. No. 10/015920 (docket RPS920010130US1), "Method and System for Use of a Field Programmable Function within a Chip to Enable Configurable I/O Signal Timing Characteristics".

R. T. Bailis et al., U.S. Pending patent application Ser. No. 10/015923 (docket RPS920010131US1), "Method and System for Use of a Field Programmable Function within a Standard Cell Chip for Repair of Logic Circuits".

R. T. Bailis et al., U.S. Pending patent application Ser. No. 10/015921 (docket RPS920010132US1), "Method and System for Use of a Field Programmable Gate Array (FPGA) Cell for Controlling Access to On–Chip Functions of a System on a Chip (SOC) Integrated Circuit".

* cited by examiner

FIELD PROGRAMMABLE NETWORK PROCESSOR AND METHOD FOR CUSTOMIZING A NETWORK PROCESSOR

CROSS-RELATED APPLICATIONS

The present application is related to the following listed seven applications: "Ser. No. 10/016,772 (RPS920010126US), entitled "Method and System for Use of an Embedded Field Programmable Gate Array Interconnect for Flexible I/O Connectivity;" "Ser. No. 10/016,449 (RPS920010127US 1), entitled "Method and Use of a Field Programmable Gate Array (FPGA) Function Within an Application Specific Integrated Circuit (ASIC) to Enable Creation of a Debugger Client Within the ASIC;" Ser. No. 10/016,448 (RPS 920010128US 1), entitled "Method and System for Use of a Field Programmable Function Within an Application Specific Integrated Circuit (ASIC) To Access Internal Signals for External Observation and Control;" Ser. No. 10/015,922 (RPS920010129US1), entitled "Method and System for Use of a Field Programmable Interconnect Within an ASIC for Configuring the ASIC;" Ser. No. 10/015,920 (RPS920010130US1), entitled "Method and System for Use of a Field Programmable Function Within a Chip to Enable Configurable I/O Signal Timing Characteristics;" Ser. No. 10/015,923 (RPS920010131US1), entitled "Method and System for Use of a Field Programmable Function Within a Standard Cell Chip for Repair of Logic Circuits;" and Ser. No. 10/015,921 (RPS920010132US1), entitled "Method and System for Use of a Field Programmable Gate Array (FPGA) Cell for Controlling Access to On-Chip Functions of a System on a Chip (S)C) Integrated Circuit;" assigned to the assignee of the present application, and filed on the same date.

FIELD OF THE INVENTION

The present invention relates generally to network processors and specifically to network processors that are field programmable.

BACKGROUND OF THE INVENTION

Network processors, the engines that control and route Internet traffic must constantly evolve to meet increasing performance demands, provide new functions and support new hardware and software interfaces. The amount of time available to design and produce these processor chips is shrinking in order to meet today's time to market demands. These network processors are designed primarily using one of two methods:

1. A general purpose network processor (NP) chip produced in volume by the NP manufacturer, sold to multiple customers and customized with software to implement customer-specific functions.
2. Application specific integrated circuit (ASIC) chips where customer-specific functions are implemented in hardware and produced in smaller volumes for a single customer.

There are advantages and disadvantages to both of these approaches. The general purpose network processor is generally more cost-effective than the ASIC solution because a single part number can be produced in large quantities and be purchased for a lower cost than a low-volume custom chip solution and can also provide faster time to market because customer-specific functions are coded in software, not implemented in hardware. The disadvantage is that the customer-specific functions are limited to the performance achievable with software, which may be significantly slower than if the function were implemented in silicon.

The primary advantage of the custom ASIC solution is performance because the hardware is optimized to each customer's function. The obvious drawback is the cost and time-to-market associated with developing customer-specific hardware.

In both the general purpose NP chip and ASIC implementations, the chip designer must decide on exactly what functions and input/output (I/O) interfaces will be supported before committing the design to silicon. Changes required to support changing I/O standards or fix errors found in high-risk logic result in costly hardware respins and potential loss of market.

What is needed is the ability to combine the flexible features on the programmable general purpose processor with the ability to adapt that hardware in the field to customer-specific functions, implement bug fixes and respond to changing I/O interface standards.

The present invention addresses such a need.

SUMMARY OF THE INVENTION

A network processor is disclosed. The network processor comprises a plurality of standard cells; and at least one field programmable gate array (FPGA) cell that can communicate with at least one of the standard cells. The at least one FPGA cell can provide a specified function based upon field programming techniques to allow for customization of the network processor.

Utilizing a method and system in accordance with the present invention, a network processor can be customized to implement a variety of functions in hardware using embedded FPGA macros. The combined technology of ASIC standard cells plus FPGA cells enables fast time-to-market for new designs while optimizing cost and performance. In addition, the combined ASIC plus FPGA on a single die allows the chip developer to use proven standard cell macros for common logic and programmable cells for high-risk logic. Through a system and method in accordance with the present invention a business process is also provided whereby an ASIC customer can either submit a custom logic file to a vendor or choose from a library of functions to program into the FPGA portion of the chip.

DETAILED DESCRIPTION

The present invention relates generally to network processors and specifically to network processors that are field programmable. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A field programmable network processor in accordance with the present invention combines the flexibility and time-to-market of a general purpose network process with the ability to customize portions of the silicon in the field. This can be accomplished by adding field-programmable gate array (FPGA) cells to the general purpose network processor chip. Customer-specific functions, high-risk logic and I/O interfaces can be implemented in the FPGA portion of the chip in the field using standard FPGA programming techniques. FPGA cells can be manufactured on the same silicon die as standard cell gates using existing manufacturing techniques.

Figure 1:
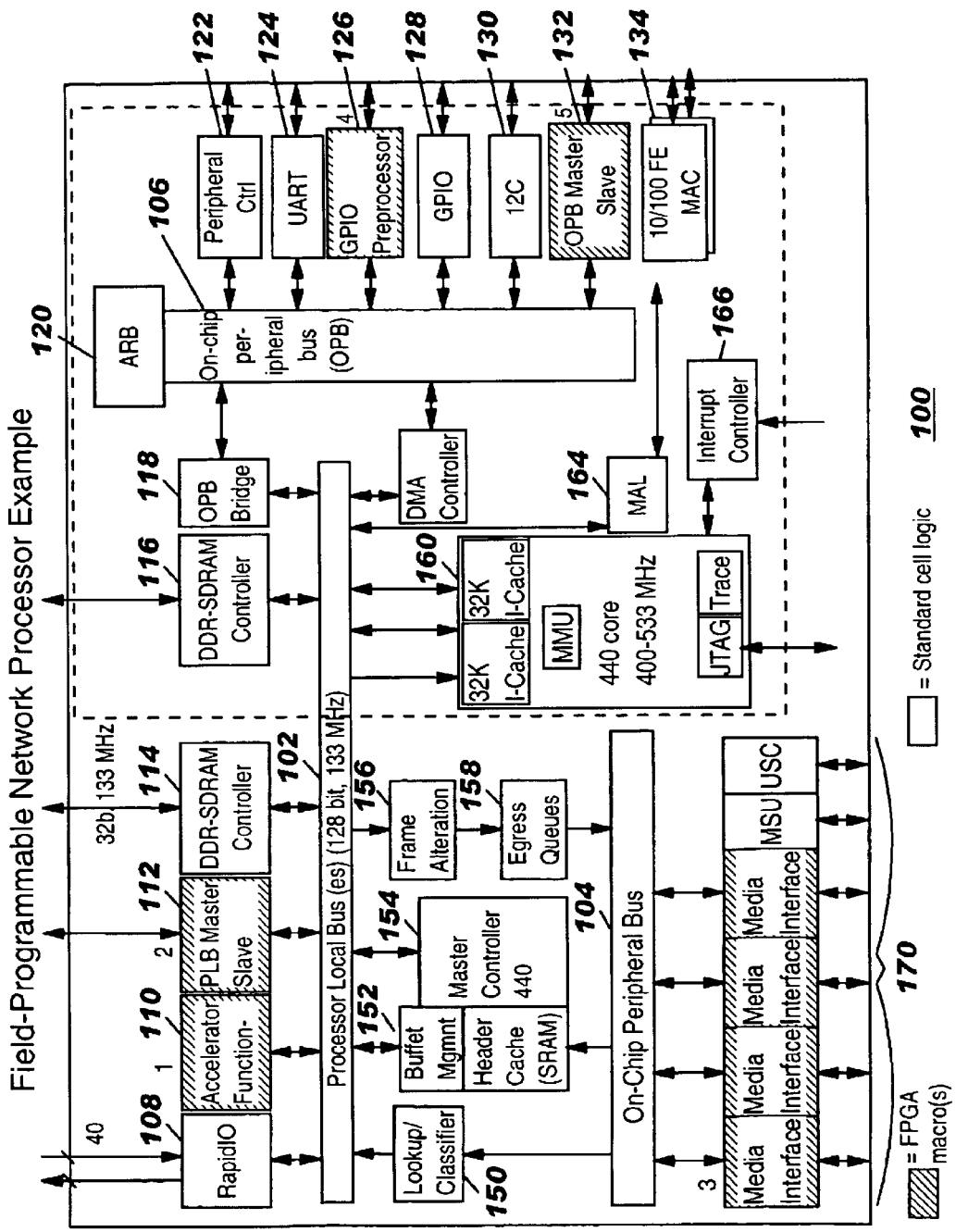
FIG. 1 is a functional block diagram of a network processor.

FIG. 1 is a functional block diagram of a network processor 100. Although a particular type of network processor is shown, one of ordinary skill in the art recognizes that the present invention could be utilized with a variety of network processors that include many of the same elements or different elements and that use would be within the spirit and scope of the present invention.

As is seen, the network processor 100 includes a processor local bus (PLB) 102, and two on-chip peripheral busses (OPB) 104 and 106. As is also seen, there are a plurality of functional blocks coupled to these busses 102, 104 and 106. As is seen, a rapid I/O 108, an accelerator function 110, a PLB master/slave function 112, SDRAM controllers 114 and 116 and an OPB bridge 118 are all in communication with the PLB 102.

The OPB bridge 118 is also in communication with an on-chip peripheral bus 106, which also includes an arbitration unit 120. There are a plurality of devices that interact with the on-chip peripheral bus 106. As is seen, they include a peripheral controller 122, a UART 124, a GPIO preprocessor 126, a GPIO 128, an OPB master/slave function 132. An I$^2$c device is also coupled to OPB 106. There are a plurality of devices, as is seen, that communicate from the PLB 102 to the OPB 104. They include the look up classifier 150, a buffer management header cache 152, a frame alteration function 156 and egress queues 158. A master controller 154 is also coupled to the processor local bus.

The PLB 102 also communicates with a microprocessor 160, a media access layer (MAL) function 164 which is in communication with a media access controller 134. An interrupt controller 166 receives signals from the outside, which are provided to the microprocessor 160. The microprocessor 160 includes a first and second instruction caches, a memory management unit (MMU), a JTAG function and a trace cache. There are also a plurality of media interfaces 170 coupled to the OPB 104.

There are several elements, which could be implemented as field programmable functions. These are primarily functions that are functions that could be changeable depending upon a particular customer involved. Accordingly, it is desirable that several of these blocks be changed into FPGA cells to allow them to be programmable in the field. In this example, it has been determined by experience and empirical evidence that the accelerator function 110, the PLB master/slave functions 112, the GPIO preprocessor 126, the on-chip media interfaces 170, and the OPB master/slave function 134 could all be implemented as FPGA cells to customize the network processor.

Below is a representative list of functionality within the functional blocks, which could be customized.

1. Hardware Accelerator Function 110
Bandwidth Allocation Technology (BAT)
IP Header Compression
Checksum Computation
Protocol Conversion
Hardware Conversion function for gateway
Layer Two bridge function
2. PLB Master/Slave Function 112
Customer Proprietary Logic
PowerPC Performance Monitor
PCI/PCI-X
Chip-to-Chip Interface Macro
Switch Interface
3. Media Interfaces 170
Ethernet, Utopia, ADASL, . . .
4. GPIO Preprocessor 126
Preprocessing functions
5. OPB Master/Slave Function 134
Customer Proprietary Function
USB 1.1->
Ethernet MAC, GPIO, UART, RS232, etc.

In addition to the above functions, the FPGA can provide customized preprocessing functions to accelerate table lookup actions, for example, for frame classification or frame forwarding. External coprocessors or Content Addressable Memories (CAMs) often require a unique interface protocol, along with external interposer chips that may be eliminated with internal FPGA functions. These may include:

Construct a table lookup key from predetermined sub fields within the packet header or payload Preformat an information packet for transfer to an external coprocessor or CAM Hash functions to reduce the length of a lookup key Append control information to message frames passed to external coprocessors Remove control information from message frames received from external coprocessors State-machine to handle handshaking protocol with an external coprocessor or CAM Pre filter functions to reduce load on external coprocessors Accordingly, common logic from network processor to network processor is implemented utilizing standard cells while the high risk or customizable logic is implemented utilizing FPGA cells. It should be understood that although particular functions have been identified as ones to implement utilizing FPGA cells, one of ordinary skill in the art recognizes that a variety of functions could be provided to be customized. In addition, one recognizes that although certain functions within the processor 100 were chosen to be implemented as FPGA cells and certain functions were chosen to be implemented as standard cells, experience and/or empirical evidence may indicate that some of the functions may become common logic that are now determined to be high risk and vice versa.

Using the above-described Field-Programmable Network Processor, a business method can be utilized to advantageously produce such customizable network processors. In order to mass-produce chips for the broadest possible market, some techniques must be available for each customer to provide unique functions, interfaces, etc. Through the use of a Field Programmable Network Processor (FPNP) for the production of very high volume chips the need for uniqueness is met, without the need for software development and its attendant performance limitations. The FPGA portion could utilize only the on chip FPGA, but may also include off chip FPGA support logic (or a combination of the two).

Typically a customer would have the ability to use the FPGA for unique functions, interfaces, etc. It would also be possible to program, using standard FPGA techniques the chips in the field to upgrade existing hardware, or in the final stages of manufacturing to customize the hardware just prior to shipment. If, as the specific application matures (and the volumes warrant it), then a lower cost custom chip could be produced for that customer.

Figure 2:
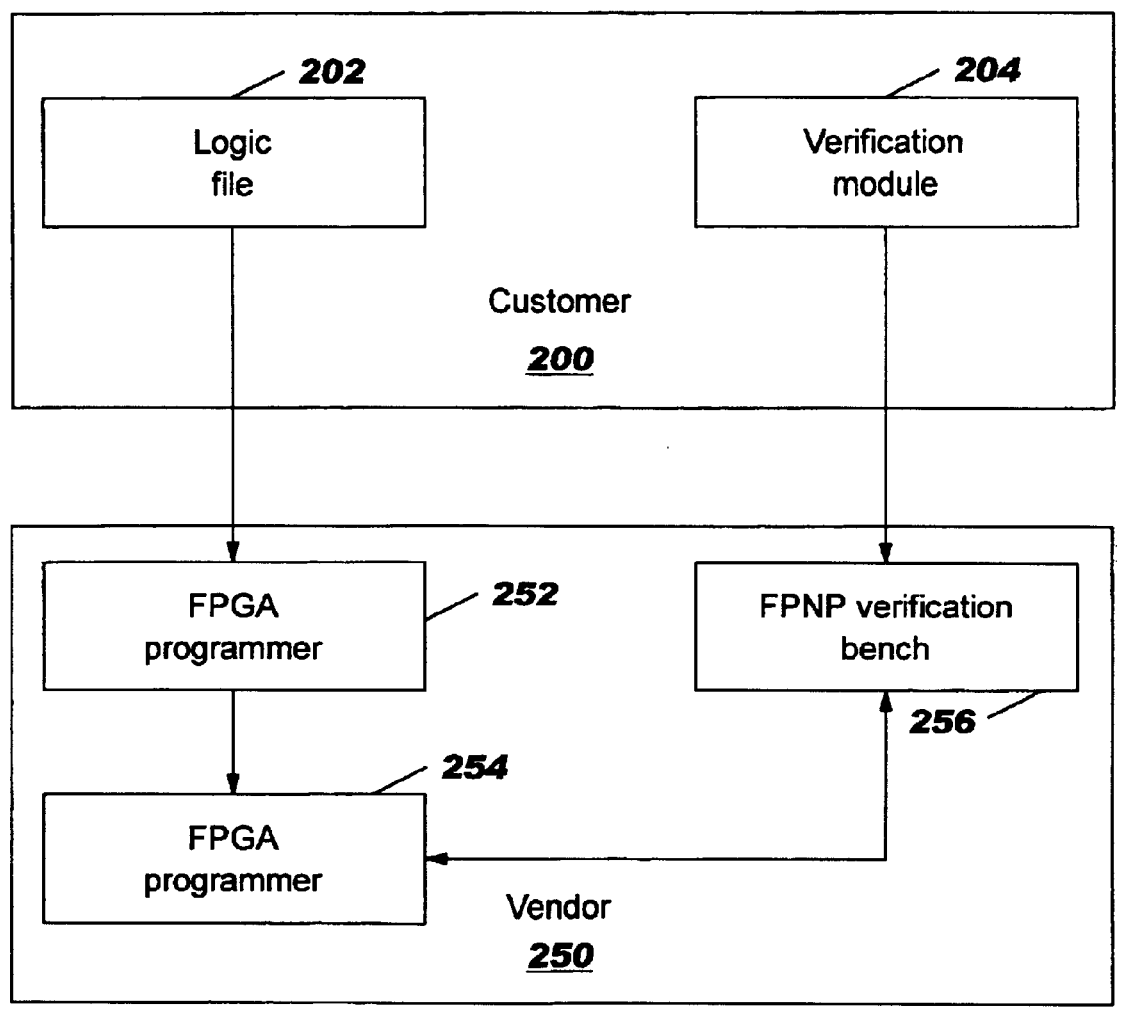
FIG. 2 is a block diagram of a system for customizing a field programmable network processor (FPNP).
Figure 3:
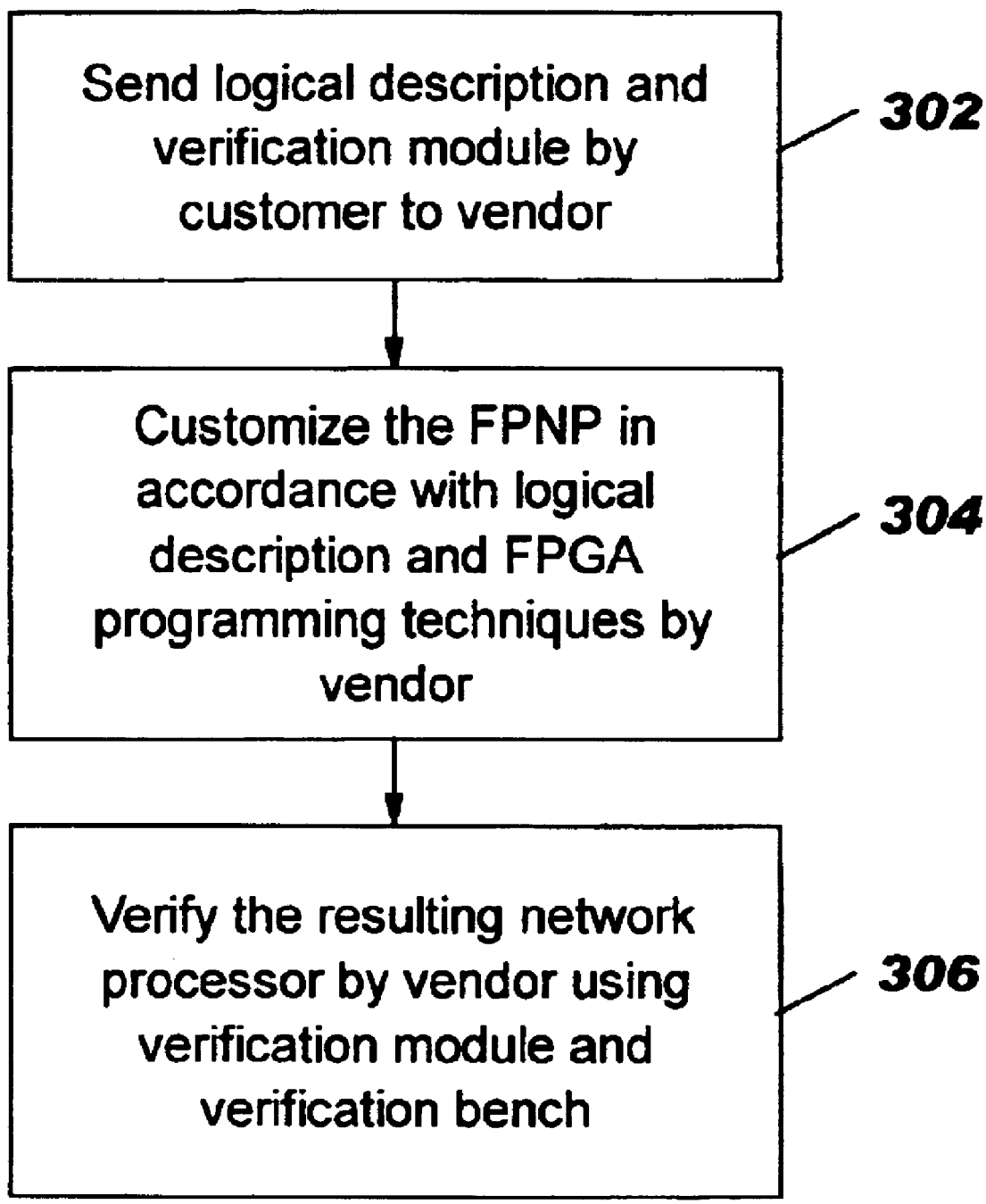
FIG. 3 is a flow chart, which illustrates a method for customizing a field programmable network processor in accordance with the present invention.

For a description of this feature, refer now to the following discussion in conjunction with the accompanying figures. FIG. 2 is a block diagram of a system for customizing a field programmable network processor (FPNP 254). A customer provides logic files 202 and a verification module to a vendor 250. The vendor includes a FPGA programmer, A FPNP and a FPNP verification bench 256. FIG. 3 is a flow chart, which illustrates a method for customizing a field programmable network processor in accordance with the present invention.

Referring to FIGS. 2 and 3 together, a customer initially wants to customize the FPNP 254 with an application-specific function. After designing and verifying his logic in software or in a stand-alone FPGA chip, a logic file 202 which includes a logic description along with a verification module 204 sent to the FPNP vendor 250 for inclusion on the FPNP 254 via step 302. The FPNP vendor can customize the FPNP chip to the customer's specification using standard FPGA programming techniques, via step 304, and verify the resulting network processor using a combination of the FPNP verification bench 256 and the verification vectors from the verification module 204 supplied by the customer 200, via step 306. The FPNP vendor 250 can then mass-program and verify chips for the end customer. The customer 200 does not have to maintain a verification environment for the entire FPNP complex, but only for his unique logic. The customer 200 also does not have to maintain the amount of FPGA programming systems needed to mass-produce the part.

A field programmable network processor in accordance with the present invention combines the flexibility and time-to-market of a general purpose network process with the ability to customize portions of the silicon in the field. This can be accomplished by adding field-programmable gate array (FPGA) cells to the general purpose network processor chip. Customer-specific functions, high-risk logic and I/O interfaces can be implemented in the FPGA portion of the chip in the field using standard FPGA programming techniques. FPGA cells can be manufactured on the same silicon die as standard cell gates using existing manufacturing techniques.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A network processor comprising:

a plurality of standard cells, the plurality of standard cells comprising common logic;

a plurality of FPGA cells, the plurality of FPGA cells comprising high risk logic; and a processor local bus (PLB) and two on-chip peripheral buses (OPBs) coupled to a portion of the standard cells and portion of the FPGA cells, wherein the FPGA cells coupled to the PLB comprise an accelerator function and a PLB master/slave function; wherein the FPGA cells coupled to one of the two OPBs are media interfaces; wherein the FPGA cells coupled to the other of the two OPBs are a GPIO preprocessor function and an OPB master/slave function; wherein the plurality of cells each can provide a specified function based upon field programming techniques to allow for customization of the network processor.

2. A network processor comprising:

a plurality of standard cells, the plurality of standard cells comprising common logic;

a plurality of FPGA cells, the plurality of FPGA cells comprising high risk logic; and a processor first bus and two peripheral buses coupled to a portion of the standard cells and portion of the FPGA cells, wherein the FPGA cells coupled to the first bus comprise an accelerator function and a second function; wherein the FPGA cells coupled to one of the two peripheral buses are interfaces; wherein the FPGA cells coupled to the other of the two peripheral buses are a third function and a fourth function; wherein the plurality of cells each can provide a specified function based upon field programming techniques to allow for customization of the network processor.

3. The network processor of claim 2 wherein the FPGA cells coupled to the first bus comprise an accelerator function and a first master/slave function.

4. The network processor of claim 2 wherein the FPGA cells coupled to one of the two peripheral busses are media interfaces.

5. The network processor of claim 2 wherein the FPGA cells coupled to the other of the two peripheral busses are a GPIO preprocessor function and a peripheral bus master/slave function.

6. A method for customizing a network processor; comprising the steps of:

(a) providing at least one field programmable gate array (FPGA) cell and a plurality of standard cells within the network processor wherein said at least one FPGA comprises high risk logic and said plurality of standard cells comprise common logic;

(b) providing a custom logic file for a vendor of the network processor by a customer of the network processor wherein step (b) further comprises (b1) providing a verification module within the custom logic file; and (c) programming the at least one FPGA cell by the vendor based upon the custom logic file to provide a customized network processor; and d verifying the customized network processor based upon the verification module.

* * * * *